United States Patent [19]
Mahler

[11] Patent Number: 4,892,451
[45] Date of Patent: Jan. 9, 1990

[54] APPARATUS FOR THE QUASI-CONTINUOUS TREATMENT OF SUBSTRATES

[75] Inventor: Peter Mahler, Hainburg, Fed. Rep. of Germany

[73] Assignee: Leybold-Aktiengesellschaft, Hanau am Main, Fed. Rep. of Germany

[21] Appl. No.: 142,087

[22] Filed: Jan. 11, 1988

[30] Foreign Application Priority Data

Jan. 30, 1987 [DE] Fed. Rep. of Germany ....... 3702775

[51] Int. Cl.⁴ .......................... B65G 49/06; F27D 3/12
[52] U.S. Cl. .................................... 414/217; 414/225; 414/404; 414/416
[58] Field of Search ............... 414/154, 217, 222, 225, 414/416, 417, 404; 198/394

[56] References Cited
U.S. PATENT DOCUMENTS

| | | | |
|---|---|---|---|
| 3,997,065 | 12/1976 | Saksch | 198/394 X |
| 4,500,407 | 2/1985 | Boys et al. | 414/225 X |
| 4,603,897 | 8/1986 | Foulke et al. | 414/416 X |
| 4,749,465 | 6/1988 | Flint et al. | 414/217 |

FOREIGN PATENT DOCUMENTS

8706561 11/1987 World Int. Prop. O. .......... 414/217

Primary Examiner—David A. Bucci
Attorney, Agent, or Firm—Felfe & Lynch

[57] ABSTRACT

In an apparatus for the treatment of substrates supplied in cassettes, with a series of lock chambers and treatment chambers, with a transport system for transporting at least one substrate holder through the chambers, and with a loading station, the problem of loading the apparatus with substrates from a moving belt without the need to hold the substrates in form-fitting mountings is solved as follows: (a) the substrate holders are constructed so as to hold one substrate at a time at an acute angle to a vertical plane, and (b) the loading station has a means for shifting at least one cassette and a manipulator system whereby the movements of extracting the substrate from the cassette and inserting it into the cassette can be performed in the perpendicular direction and whereby the substrate can be brought by a rotation of 90 degrees into a slanting position which corresponds substantially to the position of the receiving plane of the substrate.

14 Claims, 9 Drawing Sheets

APPARATUS FOR THE QUASI-CONTINUOUS TREATMENT OF SUBSTRATES

BACKGROUND OF THE INVENTION

The invention relates to an apparatus for the quasi-continuous treatment, especially for the coating, of tabular substrates supplied in cassettes, having a series of lock chambers and treatment chambers containing treatment apparatus, having a transport system for transporting at least one substrate holder through the chambers and a loading station for loading the substrate holder with a substrate from the cassette, and unloading a substrate from the substrate holder into the cassette.

The treatments can be any of a great variety for controlling the coating process and or the structure of the coating and/or the properties of the substrates. These treatments include not only coating process but also etching processes, as well as cleaning and heat treating processes and processes for the reactive after-treatment of coatings including controlled cooling processes.

The tabular substrates can be circular, discoidal such as CD disks and magnetic disks, approximately circular disks such as wafers, or even rectangular or square plates such as are required for many other optical and/or electronic purposes. The apparatus, however, is preferentially suitable for substrates in plate form whose outline corresponds more or less to a circle.

Quasi-continuous treatment is a treatment in which the substrates enter step by step into the apparatus through a lock and leave it again through a lock, but uninterruptedly as far as the end result is concerned. Any temporary stopping is caused as a rule by the lock chambers and/or by stopping during the individual steps of the treatment.

It is known to supply tabular substrates, such as wafers for example, in cassettes which are equipped with holders to maintain spaces between the individual substrates. These holders also put the principal or central planes of the individual substrates in a vertical position. It has proven difficult, however, to take the substrates singly out of the cassettes and insert them in substrate holders when the substrates are to be transported through the apparatus in a vertical position. For this purpose the substrate holder must be provided with holding or catch means to prevent the substrates from falling out of the holder. This placed a great limitation on the use of automatic manipulators.

The invention therefore is addressed to the problem of improving an apparatus of the kind described above so that it can be loaded with substrates and the substrates can be unloaded again by means of a simple and reliably operating automatic loading station on the running conveyor belt, without the need for holding the substrates in all spatial coordinates in form-fitting mountings and without the risk of their falling out of the substrate holders.

SUMMARY OF THE INVENTION

The solution of the stated problem is accomplished according to the invention, in the apparatus described above, in that (a) the substrate holder is equipped with projections for the mounting of one tabular substrate by gravity alone in a receiving plane which is at an acute angle to a vertical plane, the receiving plane being simultaneously disposed parallel to the treatment directions, and that (b) the loading station has a shifting means for at least one cassette and a manipulator means disposed in the range of displacement of the cassette, whereby the movement of inserting the substrate into the cassette or taking it out can be performed in a vertical direction, and whereby the substrate can be brought by a turning movement of 90 degrees into a slanting position substantially corresponding to the position of the receiving plane of the substrate holder, in which the substrate can be placed on the projections or raised therefrom by means of the manipulator.

The acute angle formed by the receiving plane with the vertical is best between 3 and 10 degrees, preferably between 5 and 7 degrees.

On the one hand, this angle is relatively small, so that the substrates at least do not sag markedly due to gravity, but on the other hand the low angle is quite sufficient to hold the substrate reliably, by gravity alone, on the projections, and to transport it by means of the substrate holder through the entire apparatus.

The projections can easily be so made as neither to interfere with the treatment process, i.e., to block the coating material during the coating process, nor to adversely affect the thermal economy or the thermal equilibrium between the substrate and substrate holder.

The difficulty consists in the fact that the substrates are crowded together in the cassette and shield one another's surfaces against the treatment, but for the purpose of their treatment they have to be arranged such that at least one surface, in some cases even both surfaces, can be exposed freely to the treatment.

One especially advantageous embodiment of the invention is characterized by the fact that the manipulator system has a lifting and turning column with an arm on which a substrate grabbing means is disposed, and that the turning and shifting axis of the column lies in a vertical plane parallel to the planes of the substrates mounted in the cassette, and that in this plane the turning and shifting axis forms an acute angle with the vertical, and this angle corresponds substantially to the acute angle between the receiving plane and the vertical.

It is advantageous for the acute angle of the turning and shifting axis to be at an angle between 2 and 9 degrees, preferably between 4 and 6 degrees, to the vertical.

An especially space-saving apparatus of the kind described above is characterized, according to the further invention, by the fact that the series of lock chambers and treatment chambers is in a C-shaped configuration, such that the treatment chambers form a first, aligned series of abutting chambers, and that the lock chambers form a second aligned series of chambers parallel to the first series, while the lock valves directed to the atmosphere are aligned with one another and enclose between them a space serving for loading purposes, and that lastly the two rows are joined together at their adjacent ends by a cross-transport chamber in which the substrate holders can be transferred by a transfer means, without changing their angle with respect to a vertical plane running in the transport direction, from a first branch of the transport system to the second branch, parallel thereto, of the transport system.

It is at the same time especially advantageous if the outside walls parallel to the transport direction and the active surfaces of the treatment apparatus are in their entirety tilted at an acute angle which corresponds to the attitude angle of the receiving plane of the substrate holders.

The expression, "active surfaces of the treatment apparatus," as used herein, is to be understood, in the case of tabular electrodes for electrostatic discharge cleaning or for etching, and, in the case of tabular electrodes for coating, to refer to the surface of electrode or target disposed plane-parallel to the substrate surface.

Additional advantageous embodiments of the subject matter according to the invention will be found in the rest of the subordinate claims.

DETAILED DESCRIPTION OF A PREFERRED EMBODIMENT

Figure 1:
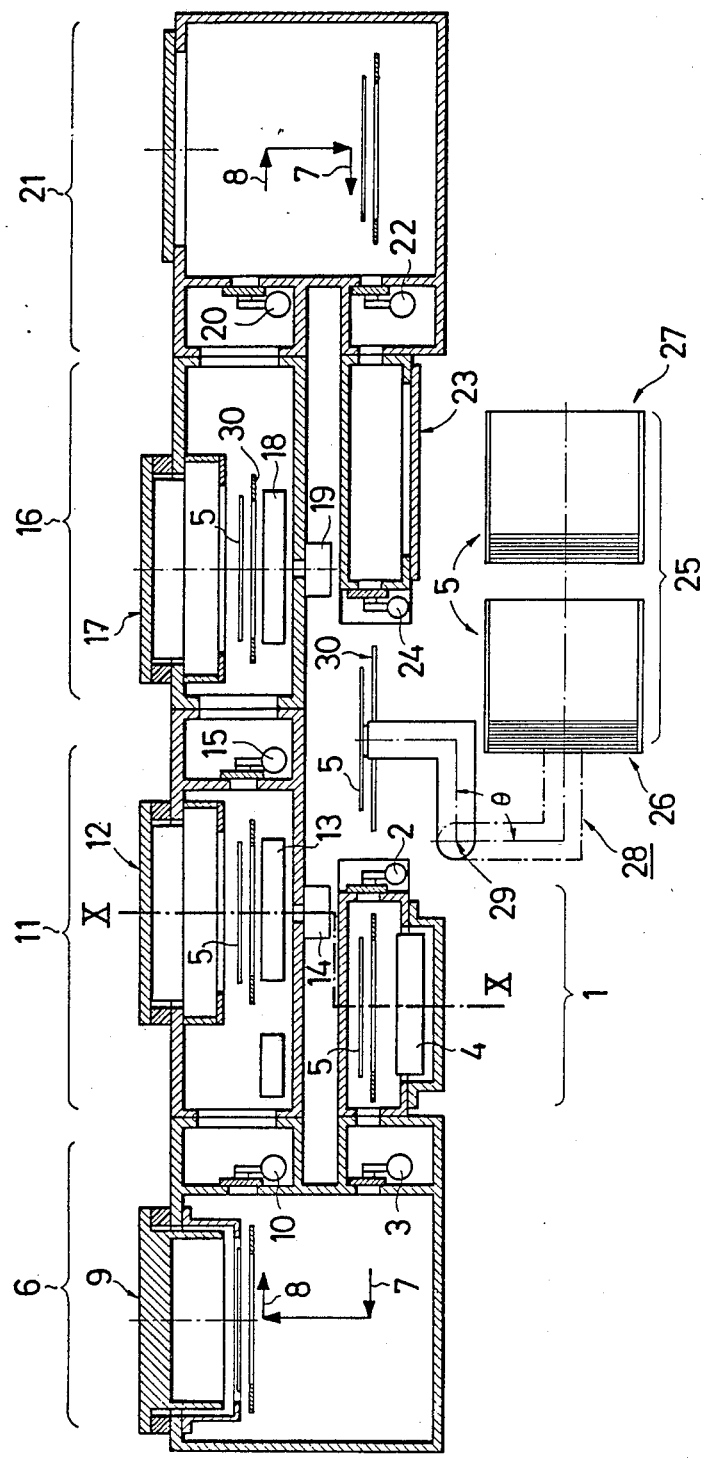
FIG. 1 is a plan view of a schematic representation of the complete apparatus with arrows indicating the path of movement of the substrates.

FIG. 1 represents the basic construction of the complete apparatus. This apparatus contains an entry lock 1 with lock valves 2 and 3 and a heating system 4 for preheating a substrate 5.

The entry lock 1 is adjoined by a cross-transport chamber 6 in which the substrate can be turned in the direction of the arrows from a first branch 7 of the transport system to a second branch 8. Additional details will be explained with the aid of FIG. 4. In a side wall of the cross-transport chamber 6 there is also an etching device 9 which is constructed in a conventional manner as a glow discharge system. The cross-transport chamber 6 is connected by an additional lock valve 10 to a treatment chamber 11 in whose one side wall is a sputtering cathode 12 by which the substrate 5 can be provided with a first coating. On the back of the substrate 5 is an additional heating system 13 with which a temperature sensor 14 is associated.

The treatment chamber 11 is connected by a lock valve 15 to an additional treatment chamber 16 which bears in its one side wall an additional sputtering cathode 17 with which the substrate 5 can be coated in a similar manner. Opposite this sputtering cathode is a heater 10 with a temperature sensor 19.

The treatment chamber 16 is connected by a lock valve 20 to another cross transport chamber 21 in which the substrates are turned in the direction of the arrows from branch 8 of the transport system back to branch 7 of the transport system. The cross transport chambers 6 and 21 serve simultaneously as what are known as high-vacuum locks. From the cross transport chamber 21 a lock valve 22 leads to the exit lock 3 at whose end again a lock valve 24 is provided. The connecting of the apparatus to the atmosphere is produced by the two lock valves 2 and 24. The transport system and all lock valves are positively controlled by a conventional central unit which is not shown.

It can be seen that the sequence of lock chambers 1 and 23 and treatment chambers 11 and 16 are in a C-shaped arrangement in which the treatment chambers 11 and 16 form a first aligned row of abutting chambers and the lock chambers 1 and 23 form a second aligned row of chambers parallel to the first row, while the lock valves 2 and 24 directed to the atmosphere are opposite one another and enclose between them a space serving for loading purposes, which will be further discussed below.

It can furthermore be seen that the two rows are connected together at their adjacent ends by one of the cross transport chambers 6 and 21 in which the substrate holders can be turned one way and the other. Details on the turning system will be further described in conjunction with FIG. 4.

Also shown in FIG. 1 is a loading station 25 in which two cassettes 26 and 27 are located, which here are indicated only by the substrates contained in them, in the form of parallel lines. The loading station 25 includes a shifting means which is likewise controlled by the central unit, so that one substrate at a time, taken from a cassette, can be located at a precisely predetermined place in the same cassette or in a following cassette.

In the area of the loading station 25 there is furthermore a manipulator 28 the details of which will be discussed in conjunction with FIGS. 8 and 9. The manipulator includes a turning and lifting column 29 which can be rotated through an angle $\theta$ of 90 degrees. This manipulator 28 can remove the substrates 5 singly from the cassettes 26 and 27 and place them each into one substrate holder 30 by which they can be transported through the entire apparatus in the direction of the arrows. The substrate holder 30 is shown returning in various positions. It is apparent that such an apparatus is regularly equipped with a plurality of substrate holders, of which at least one is in the area of the loading station while the others are transported cyclically through the apparatus.

Figure 2:
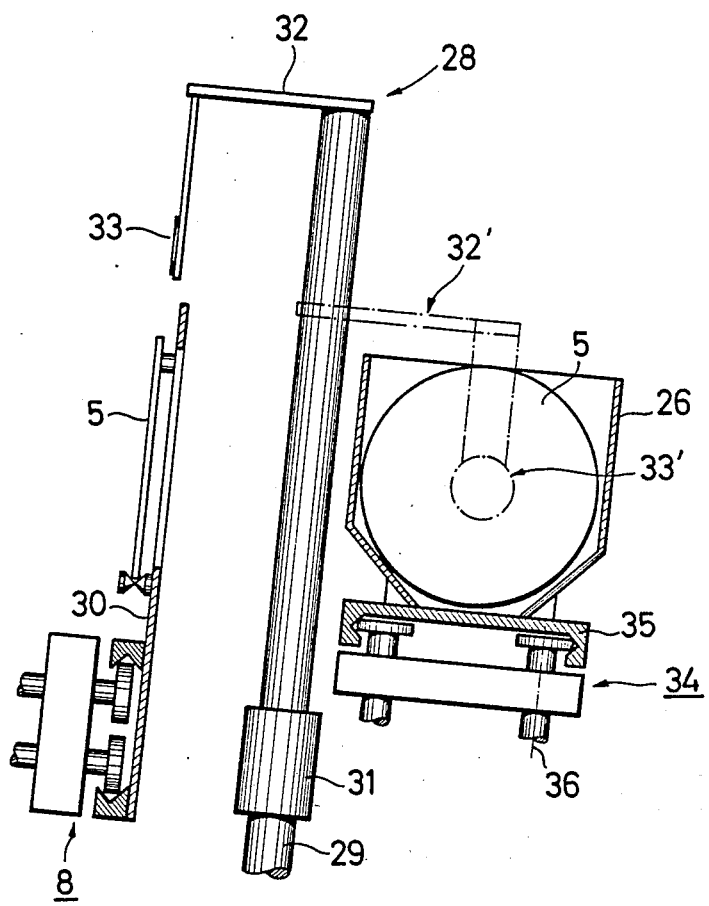
FIG. 2 is a vertical section taken through the apparatus in the area of the loading stations.

In FIG. 2 is shown the cooperation of the manipulator 28 with a cassette 26 and a substrate holder 30 the same as in FIG. 1. The turning and lifting column 29 is able to rotate in two bearings 31 and can be raised and lowered, as is indicated by an arm 32 which can be brought around to a position 32'. At the end of this arm 32 is a suction cup 33 and 33' to pick up a substrate 5.

The cassette 26 is disposed on a shifting means 34 which is part of a carriage guide 35 by which the cassette can be moved perpendicular to the plane of the drawing. The drive is performed by means of transport wheels, not shown, one of which is driven by a shaft 36. The transport wheels are included in the carriage guide 35.

As it can be seen in FIG. 2, the turning and lifting column 29 is at an acute angle to the vertical, being situated in a vertical plane (in the plane of the drawing) which is parallel to the planes of the substrates 5 stored in cassette 26. In this plane, however, it is at an acute angle to the vertical, which corresponds substantially to acute angle between the pickup plane and the vertical (FIG. 8).

Details of the second branch 8 of the transport system are shown diagrammatically in FIG. 2. For further details, however, see FIG. 10.

Figure 3:
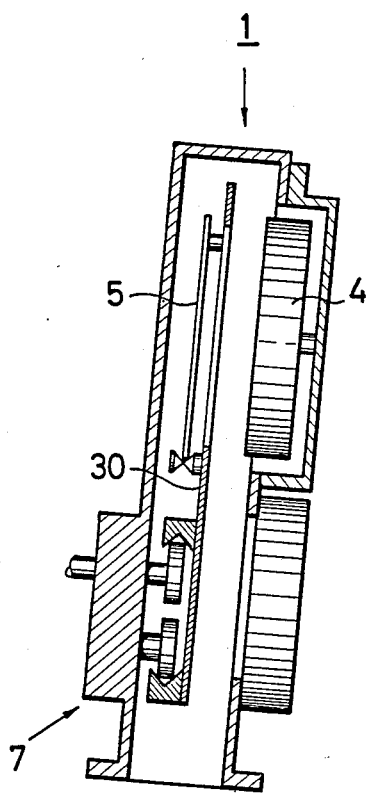
FIG. 3 is a vertical section taken through the apparatus in the area of the first vacuum lock equipped with a heating system.

FIG. 3 represents a vertical section through the entry lock 1 in the first branch 7 of the transport system.

Figure 4:
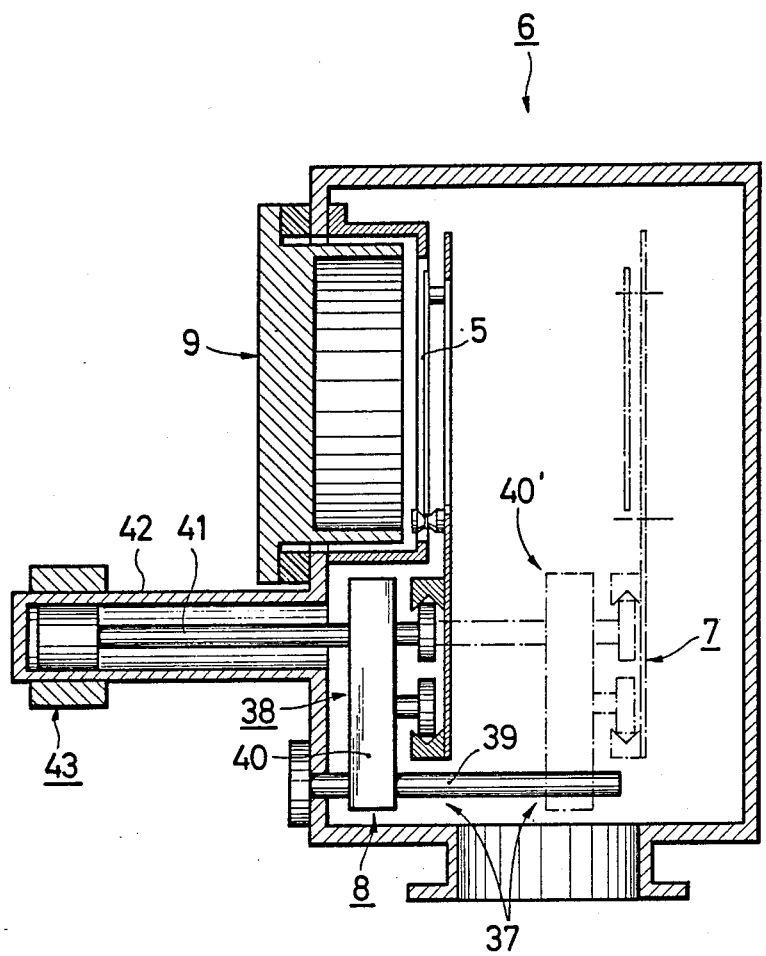
FIG. 4 is a vertical section taken through one of the cross transport chambers for the transfer of the substrate holders from one branch of the transport system to the other branch of the transport system.

FIG. 4 shows a vertical section through the cross transport chamber 6 in which the first branch 7 and the second branch 8 of the transport system terminate. In this area the turning means 38 has a wheel carrier 40 which can be moved transversely on shafts 39' and which can be shifted on the shafts 39 to the position 40' indicated in broken lines. On the wheel carrier 40 there are disposed two pairs of wheels situated one behind the other in the direction of viewing and not further indicated, at least one of which can be driven by a shaft 41. Shaft 41 is situated in a tube 42 joined hermetically to the cross transport chamber 6 and bears on its end the inner part of a magnetic coupling 43 whose outer part is rotatable and longitudinally displaceable on the tube 42. In this manner the magnetic coupling is always engaged regardless of the position of the wheel carrier 40 or 40'. The two positions 40 and 40' of the wheel carrier represented in FIG. 4 correspond to the position of alignment with corresponding stationary pairs of wheels of the first branch 7 and second branch 8 of the transport system 37.

It can be seen that the substrate holder 30 with the substrate 5 can be transferred in the transverse direction by the system shown in FIG. 4 from the first branch 7 to the second branch 8 of the transport system.

Figure 5:
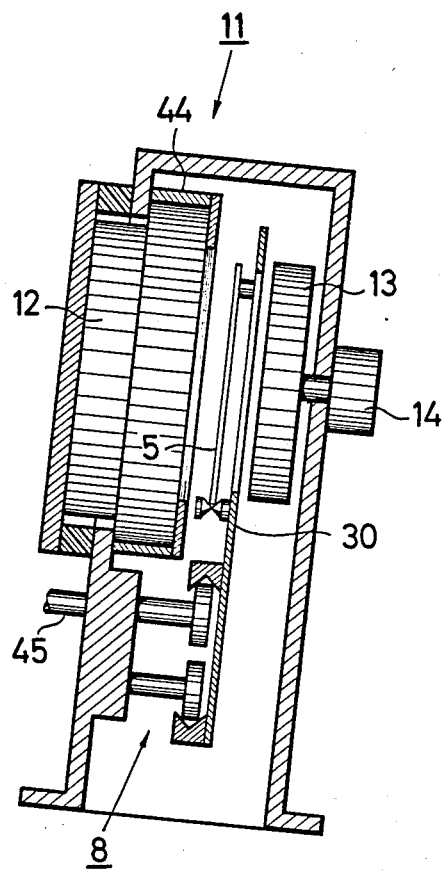
FIG. 5 is a vertical section through one of the treatment chambers with a heating system.

FIG. 5 again shows details in the area of the treatment chamber 11, but to avoid repetition reference is made to FIG. 1. The sputtering cathode 12 includes a grounding shield 44. Details of such sputtering cathodes are, however, state of the art, so that there is no need to discuss them in greater detail. It is also shown that one of the stationary wheels of the second branch 8 of the transport system is provided with a drive shaft 45 in order to assure the advancement of the substrate holder 30 through the apparatus.

Figures 6, 7:
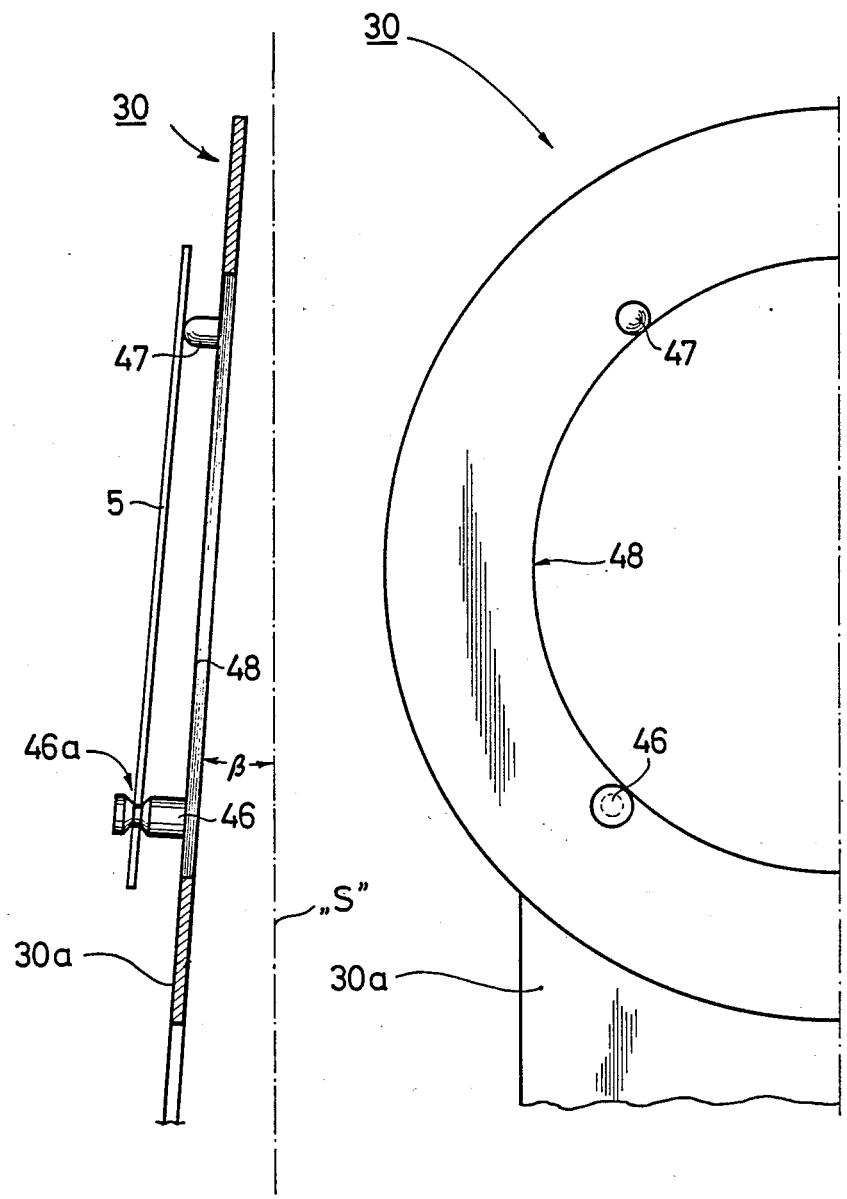
FIG. 6 is an enlarged vertical section through the upper part of a substrate holder with the substrate mounted.
FIG. 7 is a halved front view of the subject of FIG. 6, but without a substrate.

FIGS. 6 and 7 show the upper part of the substrate holder 30, in section in FIG. 6 and in a halved front view in FIG. 7. The substrate holder is provided with pairs of lower projections 46 and upper projections 47 which are disposed at the margin of a circular opening 48 in the substrate holder 30. The substrate holder 30 has a base plate 30a which is at the above-mentioned acute angle to a vertical "S" and can be displaced parallel to itself in the transport direction in FIG. 6 (perpendicular to the plane of drawing). The base plate 30a is provided in the lower area of the substrate 5 with the two projections 46 mentioned above, which are provided each with a groove 46a to accommodate the bottom edge of the substrate. The two projections 47 are disposed at the upper part of the substrate and their outer ends serve to support the substrate such that the substrate 5 is held away from the base plate 30a. Thus the suction cup 33 can be inserted into the interstice between the base plate 30a and the substrate 5. The circular opening 48 serves to enable the back of the substrate 5 to interact with a treatment means, such as a source of thermal radiation.

Figure 8:
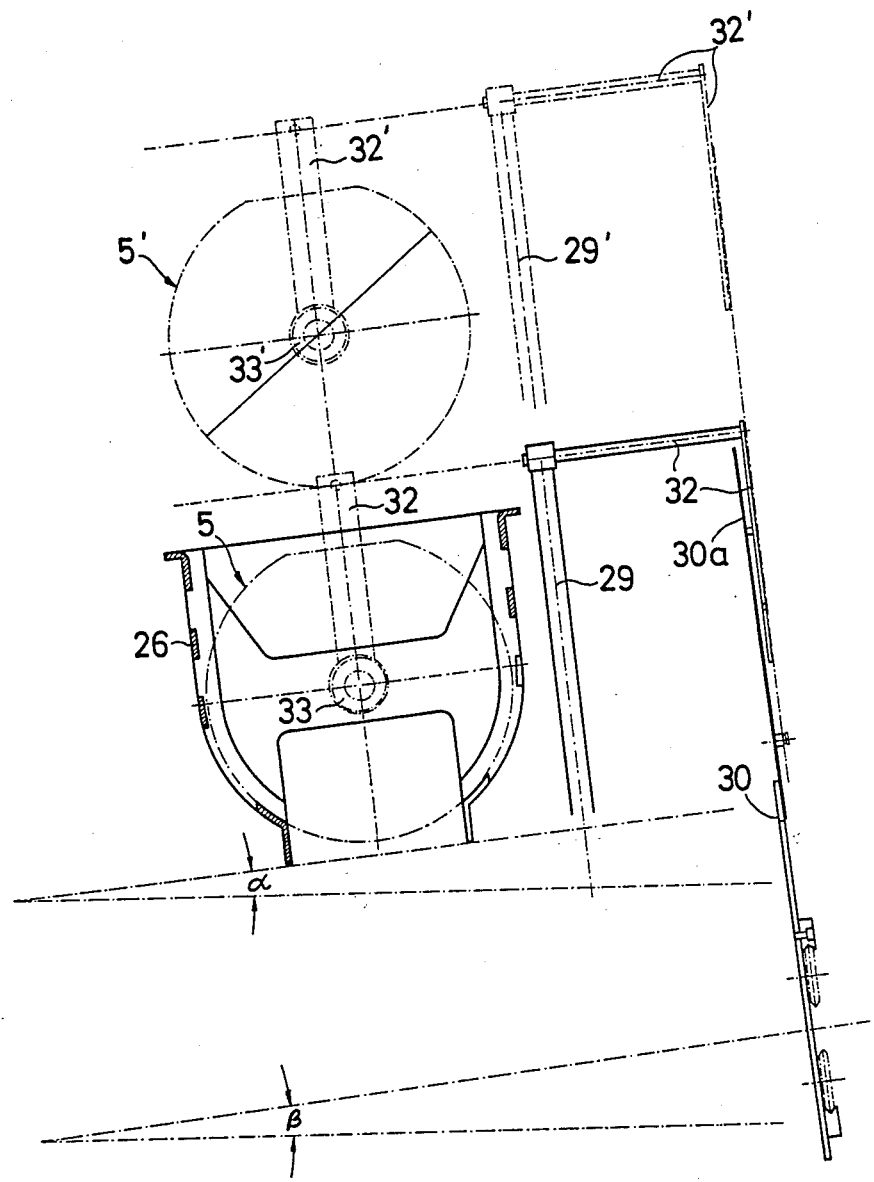
FIG. 8 is a vertical section through a cassette in conjunction with the corresponding manipulator system.
Figure 9:
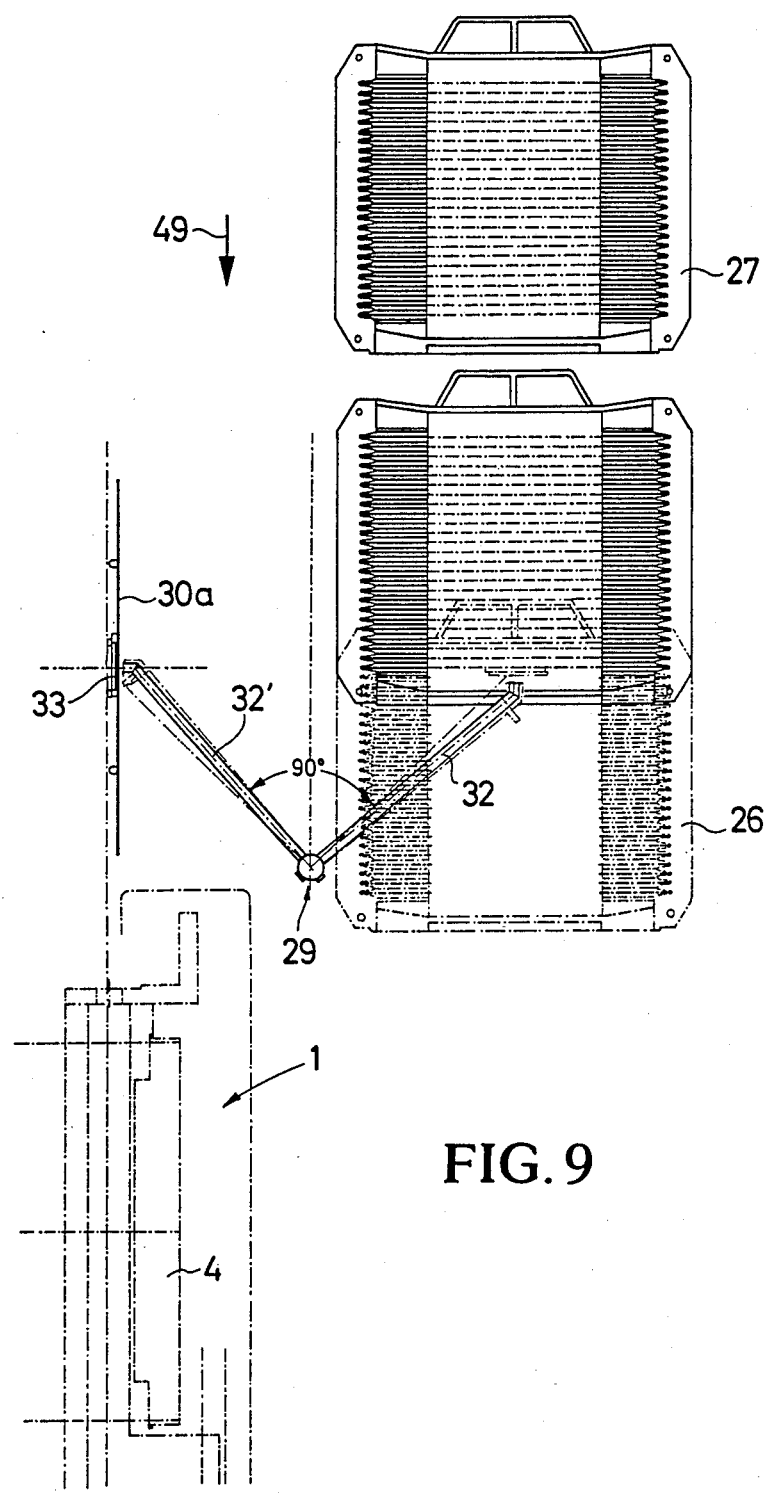
FIG. 9 is a top view of two different cassettes in conjunction with a corresponding manipulator system and the entry locks of the treatment apparatus.

The operation of the manipulator system 28 is represented on an enlarged scale in FIG. 8, in the direction opposite that of FIG. 2. The turning and lifting column 29 can be introduced together with the vacuum cup 33 into the interstice between two substrates within the cassette 46, the principal planes of these substrates being precisely vertical. By raising the turning and raising column 29 to the position 29' represented in broken lines, one of the substrates 5' can be removed from the cassette 26. Owing to the tilt at angle $\alpha$ of the turning and lifting column 29 the substrate 5 or 5' is brought by turning the arm 32 or 32' by 90 degrees to an angle that corresponds to the tilt of the turning and lifting column 29. In this position the substrate 5 or 5' can be deposited onto the projections of substrate holder 30 which have been described above. The angle formed by the turning and lifting column 29 with the vertical "S" is preferably kept 1 degree smaller than the corresponding angle $\beta$ of the receiving plane of the substrate holder 30 so that the substrate, can be placed on the projection 46 and 47 of the substrate holder 30 without any sliding movement on the ends of projections FIG. 9 is a top view again showing the circumstances according to FIG. 8, the viewing direction of FIG. 8 being indicated by the arrow 49.

Figure 10:
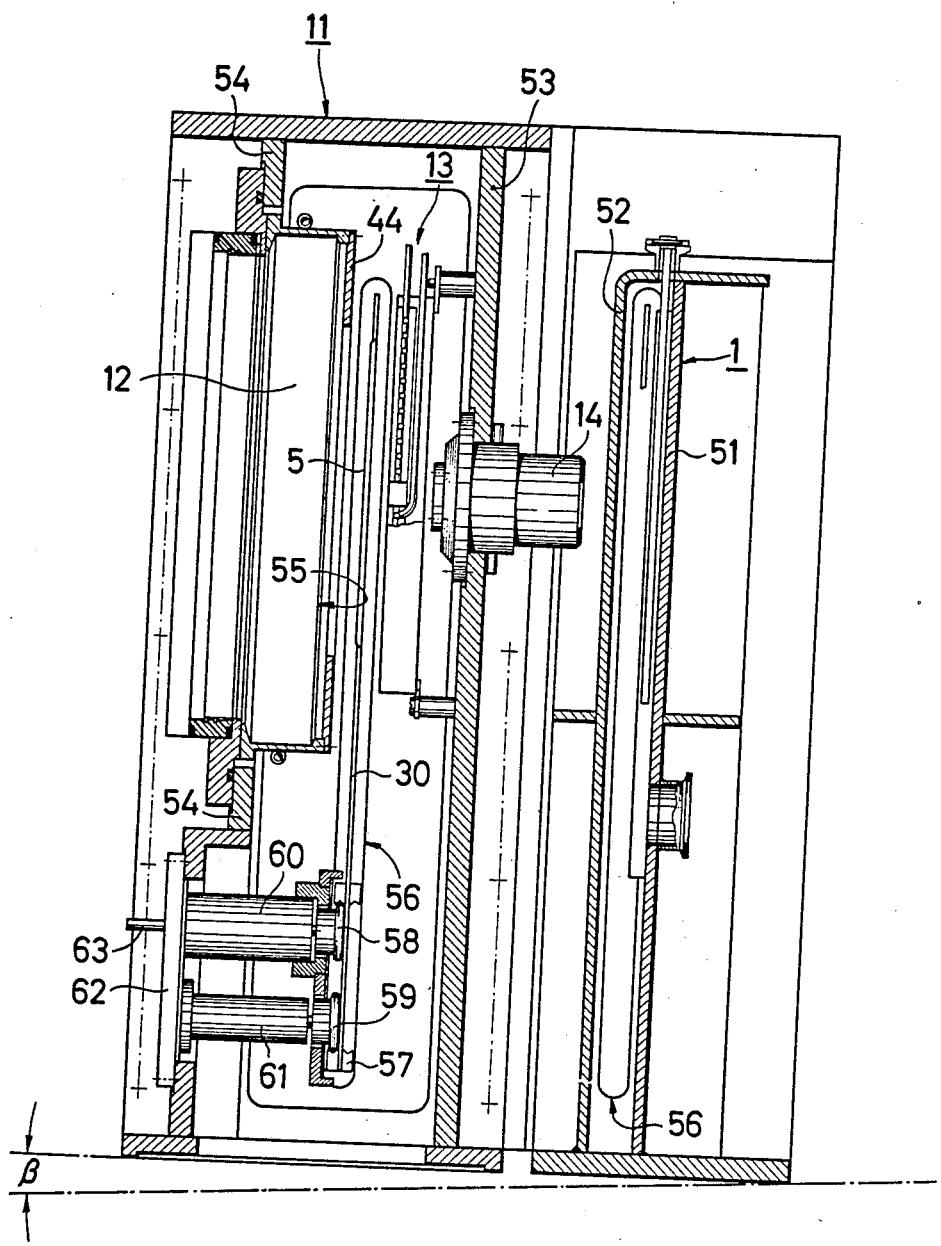
FIG. 10 is an enlarged vertical section, taken along the line X—X in FIG. 1 showing additional details in the area of a treatment station and of the entry lock.

Additional details of the design of the installation can be seen in FIG. 10.

Since most of the treatments involved here are performed under a vacuum and/or shielding gas, the lock chambers and treatment chambers etc. are so-called vacuum chambers. Their outside walls 51, 52 and 53, 54, running parallel to the direction of transport, and the active surfaces 55 of the treatment apparatus described above are tilted in their entirety at an acute angle $\beta$ which corresponds to the attitude angle of the receiving plane of the substrate holder 30. The geometrical situation of this receiving plane is defined according to FIG. 6 by the grooves 46a in the projections 46 and by the outer ends of the projections 47, the thickness of the substrate 5 being disregarded for the present, for the sake of simplicity. The position of this receiving plane thus corresponds to the position of the substrates 5, as it is clearly shown in FIG. 6. The individual treatment chambers are connected to one another by slots 56 which can be at least partially closed by the lock valves shown in FIG. 1. Each substrate holder 30 has in its lower part four guides 57 which can be fitted by means of prismatic track surfaces not further identified to transport wheels 58 and guide wheels 59 disposed in pairs. Transport and guiding wheels 58 and 59 are mounted in stationary tubes 60 and 61, respectively, which are affixed to a flange plate 62. The transport wheel 58 can be driven by a shaft 63.

The wheels 58, 59 as well as the additional wheels in front and in back of them in the viewing direction of FIG. 10 define the second branch 8 of the transport system. The first branch 7 of the transport system is defined by additional pairs of wheels not shown in FIG. 10, and they are in a mirror-image relationship, especially also in the entry lock chamber 1. In connection with FIG. 4 and the explanations relating thereto, it can also be seen how all of the substrate holders 30 can be transferred from the wheels of the first branch 7 to the wheels of the second branch 8.

I claim:

1. Apparatus for quasi-continuous treatment, especially for the coating, of tabular substrates supplied in vertical planes in cassettes, having a system of treatment chambers and transport means for the transport of at least one substrate holder through the chambers in a transport direction and with a loading station for loading the substrate holder with one substrate at a time from the cassette and unloading one substrate at a time from the substrate holder into the cassette, characterized in that
   (a) the substrate holder is equipped with projections for holding one tabular substrate at a time, by gravity alone, in a receiving plane which is at an acute attitude angle to the vertical, said receiving plane being simultaneously parallel to the treatment chambers, and
   (b) the loading station has a shifting means for shifting at least one cassette and a manipulator means disposed to extract a substrate out of the cassette and insert it into the cassette by movement parallel to the receiving plane, and by which the substrate can be brought by a ninety degree rotation to a slanting position corresponding substantially to the receiving plane of the substrate holder, in which slanting position the substrate can be lowered onto and lifted away from the projections by said manipulator means.

2. Apparatus according to claim 1, characterized in that the acute angle between the receiving plane and the vertical is between 3 and 10 degrees.

3. Apparatus according to claim 1, characterized in that the manipulator means (28) has a turning and lifting column (29) with an arm (32) on which is disposed a coupling means (33) for coupling the substrate, and that the turning and shifting axis of the column (29) lies in a vertical plane which is parallel to the planes of the substrates (5) stored in the cassette (26, 27), and that the turning and shifting axis runs in said vertical plane at an acute angle to the vertical, which angle corresponds substantially to the acute angle between the receiving plane and the vertical.

4. Apparatus according to claim 3, characterized in that the acute angle of the turning and shifting axis of the column (29) is between 2 and 9 degrees, from the vertical.

5. Apparatus according to claim 3, characterized in that the coupling means (33) is a suction cup.

6. Apparatus according to claim 1, characterized in that the substrate holder (30) has a base plate (30a) which is at said acute angle from the vertical and is displaceable parallel to itself in the transport direction, and that the base plate (30a) has in the lower area of the substrate (5) two projections (46) each with a groove (46a) for receiving a bottom margin of the substrate, and in an upper area of the substrate it has two projections (47) with extremities for supporting the substrate (5) such that the substrate (5) is held at a distance from the base plate (30a).

7. Apparatus according to claim 6, characterized in that means (33) for coupling the substrate (5) on its back can be introduced into the interstice between substrate and base plate (30a).

8. Apparatus according to claim 1, characterized in that a series of lock chambers (1, 23) and treatment chambers (11, 16) is arranged in a C-shape such that the treatment chambers (11, 16) form a first aligned row of abutting chambers and that the lock chambers (1, 23) form a second aligned row of chambers parallel to the first row, the lock chambers having lock valves (2, 24) directed to the atmosphere and directed toward one another and said lock valves enclose between them a space serving for loading purposes, and the first and second rows being joined together at adjacent ends by one cross transport chamber (6, 21) each, in which the substrate holders (30) can be transferred by a transfer means (38), without changing their tilt from a vertical plane running in the transport direction, from a first branch (7) of the transport means to a second branch (8) of the transport means that is parallel to said first branch.

9. Apparatus according to claim 8, characterized in that outside walls (51, 52; 53, 54) running parallel to the transport direction, and active surfaces (55) of the treatment chambers are in their entirety tilted at an acute angle "$\beta$" which corresponds to the attitude angle of the receiving plane of the substrate holder (30).

10. Apparatus according to claim 8, characterized in that each substrate holder (30) has guide rails (57) parallel to one another and horizontally aligned, which can be placed by means of track surfaces in a form-fitting manner on transport wheels (58) and guide wheels (59) disposed in pairs, and that the transfer means (38) has a transversely displaceable wheel carrier (40) with at least two pairs of wheels which can be brought into alignment with stationary pairs of wheels of the first (7) branch and of the second branch (8) of the transport means (37).

11. Apparatus according to claim 10, characterized in that at least one of the wheels of the displaceable wheel carrier (40) is provided with a drive shaft (41) which is connected with a drive (43) for transferring a torque and a displacement force for transverse displacement of the wheel carrier (40).

12. Apparatus according to claim 11, characterized in that the drive shaft (41) is provided with an inner element of a magnetic coupling (43) which extends into a tube section (42) consisting of nonmagnetic material, on whose outside an outer element of the magnetic coupling (43) is disposed for rotation and axial displacement.

13. Apparatus according to claim 1, characterized in that the acute angle between the receiving plane and the vertical plane is between 5 to 7 degrees.

14. Apparatus according to claim 3 characterized in that the acute angle is between 4 to 6 degrees from the vertical.

* * * * *